United States Patent
Ray et al.

(10) Patent No.: US 6,762,119 B2
(45) Date of Patent: Jul. 13, 2004

(54) METHOD OF PREVENTING SOLDER WETTING IN AN OPTICAL DEVICE USING DIFFUSION OF CR

(75) Inventors: Sudipta K. Ray, Wappingers Falls, NY (US); Mitchell S. Cohen, Bedford, MA (US); Lester Wynn Herron, New Paltz, NY (US); Mario J. Interrante, New Paltz, NY (US); Thomas E. Lombardi, Poughkeepsie, NY (US); Subhash L. Shinde, Cortland Manor, NY (US)

(73) Assignee: International Bussiness Machines Corporation, Armonk, NY (US)

( * ) Notice: Subject to any disclaimer, the term of this patent is extended or adjusted under 35 U.S.C. 154(b) by 0 days.

(21) Appl. No.: 09/885,791

(22) Filed: Jun. 20, 2001

(65) Prior Publication Data

US 2002/0196996 A1 Dec. 26, 2002

(51) Int. Cl.[7] ............... H01L 21/44; H01L 21/4763; G02B 6/12
(52) U.S. Cl. ............. 438/614; 438/612; 438/617; 438/618; 385/14
(58) Field of Search .................. 438/612–618, 438/27, 65, 69; 385/14; 257/116

(56) References Cited

U.S. PATENT DOCUMENTS

| | | | |
|---|---|---|---|
| 4,126,882 A | * | 11/1978 | Carson et al. |
| 4,945,400 A | | 7/1990 | Blonder et al. |
| 5,113,404 A | * | 5/1992 | Gaebe et al. |
| 5,179,609 A | | 1/1993 | Blonder et al. |
| 5,257,336 A | | 10/1993 | Dautartas |
| 5,259,054 A | | 11/1993 | Benzoni et al. |
| 5,337,398 A | * | 8/1994 | Benzoni et al. |
| 5,815,616 A | * | 9/1998 | Bishop et al. |
| 5,841,544 A | * | 11/1998 | Dautartas et al. |
| 5,937,124 A | | 8/1999 | Roff |

OTHER PUBLICATIONS

IEEE 1997; W. Pittroff, J. Barnikow, A. Klein, P. Kurpas, U. Merkel, K. Vogel & J. Wurfl, Electronic Components and Technology Conference *"Flip Chip Mounting of Laser Diodes with Au/Sn Solder Bumps; Bumping, Self–Alignment and Laser Behavior"*, pp. 1235–1241.

* cited by examiner

*Primary Examiner*—Ha Tran Nguyen
(74) *Attorney, Agent, or Firm*—Tiffany Townsend; Cantor Colburn LLP

(57) ABSTRACT

A process and structure for forming an optical subassembly in an integrated circuit, comprising: defining electrically conducting lines and bonding pads in a metallization layer on a substrate; depositing a passivation layer over the metallization layer; etching the passivation layer to remove the passivation layer from each of the bonding pads and a portion of the metallization layer associated with each of the bonding pads; diffusing Cr from the lines proximate said bonding pads to prevent solder wetting down lines; bonding an optical device to one of the bonding pads; and attaching the substrate to a carrier utilizing solder bond attachment.

18 Claims, 4 Drawing Sheets

US 6,762,119 B2

METHOD OF PREVENTING SOLDER WETTING IN AN OPTICAL DEVICE USING DIFFUSION OF CR

FIELD OF THE INVENTION

The present disclosure relates generally to optoelectronic devices mounted on a silicon optical bench (SiOB). More particularly, the present invention relates to a package and method for fabricating semiconductor circuits containing an optical assembly while passively maintaining the alignment of the optical assembly.

BACKGROUND OF THE INVENTION

In the realm of optoelectronics, packaging has become a factor in the ability to manufacture reliable optoelectronic devices and systems. Passive alignment of a device and the subsequent packaging of the device assures the ability to mass produce devices and systems as well as to manufacture systems and devices at as low a cost as is possible. Of course, the packaging and passive alignment of devices and systems requires a great deal of precision in order to meet the required performance characteristic. To this end, while active alignment and packaging of devices offers precision in the alignment of the device and subsequent packaging, the attendant costs in packaging, as well as the inability to produce a large quantity of devices and systems has lead to the need for a package which is precisely aligned in a passive manner.

One area of technology which holds great promise in the realm of packaging optoelectronic devices and the passive alignment of both active and passive devices in an optoelectronic system is silicon waferboard technology. In addition to its utility as a physical support, silicon provides electronics capabilities, and is useful for forming and/or supporting passive optics (e.g., waveguides, etc.). Used in such a manner, silicon serves as an "optical bench." Optical devices, systems and technology implemented in this manner are conventionally referred to as silicon optical bench (SiOB).

SiOB processing technology has advanced to the stage where a number of relatively simple procedures (e.g., oxidation, etching—isotropic or anisotropic) may be utilized to facilitate attachment of the devices to the support member, as well as alignment therebetween. Further, it is possible to form optical waveguiding structures directly in/on a silicon substrate, resulting in the ability to form a completely operable optical subassembly in silicon.

In general, utilization of silicon in the formation of a subassembly for optoelectronic devices includes a semiconductor (e.g., silicon) base and lid including a variety of etched features (e.g., grooves, cavities, alignment detents) and metallization patterns (e.g., contacts, reflectors) which enable the optoelectronic device to be reliably and inexpensively mounted on the base and coupled to a communicating optical fiber. In particular, an arrangement wherein the optoelectronic device (e.g., LED, laser diode, or photoelectric device) is disposed within a cavity formed by a lid member and the communicating fiber is positioned along a groove formed in a base member. A reflective metallization is utilized to optically couple the device to the fiber. Therefore, positioning of the device over the reflector is the only active alignment step required to provide coupling. Any remaining alignments are accomplished utilizing fiducial features formed in the base and lid members.

The assembled SiOB is typically a module for high speed switching of optical data. For reasons of contamination standard microelectronics joining, using BGA's or CGA's and cleaning steps are not desirable. In addition, alignment accuracy is more critical between various light transmitting/receiving devices (i.e., 2–4 microns) compared with the conventional tolerance used in joining silicon chips to a chip carrier (e.g., 15–30 microns). In view of the above concerns, optical switch modules are presently wire bonded to cards. Wire bonding requires a costly manual process and leads to longer wiring paths. Furthermore, laser diodes and photo diodes are presently available with wire bond termination only.

Accordingly, what is desired is a less complex assembly for mounting the optical subassembly on a single material and in a smaller package thereby reducing the costs of not only the material, but also the complexity of the fabrication and thereby the cost of the assembly, while maximizing operating performance. There is also a need to allow both wire bond attachment of optical devices, as well as solderable metallurgy on a SiOB for attaching to a chip carrier.

BRIEF SUMMARY OF THE INVENTION

A process of forming an optical subassembly in an integrated circuit, the process comprising: defining electrically conducting lines and bonding pads in a metallization layer on a substrate; depositing a passivation layer over the metallization layer; etching the passivation layer to remove the passivation layer from each of the bonding pads and a portion of the metallization layer associated with each of the bonding pads; diffusing Cr from the lines proximate said bonding pads to prevent solder wetting down lines; bonding an optical device to one of the bonding pads; and attaching the substrate to a carrier utilizing solder bond attachment.

An interconnect structure for an optical subassembly is also disclosed, the optical subassembly comprising: a carrier having a first side and a second side; a ball grid array (BGA) depending from the second side; a cavity disposed in the first side, a silicon optical bench (SiOB) having an optical device mounted thereon, the SiOB is electrically and mechanically connected to the first side utilizing a surface mount technology (SMT) attachment, the cavity providing clearance for the optical device when connecting the SiOB to the carrier, the SiOB having a metallization layer providing both wire bondable and solder bondable pads.

Other embodiments of the invention are contemplated to provide particular features and structural variants of the basic elements. The specific embodiments referred to as well as possible variations and the various features and advantages of the invention will become better understood when considered in connection with the accompanying drawings and detailed description that follows.

DETAILED DESCRIPTION OF PREFERRED EMBODIMENTS

Figure 1:
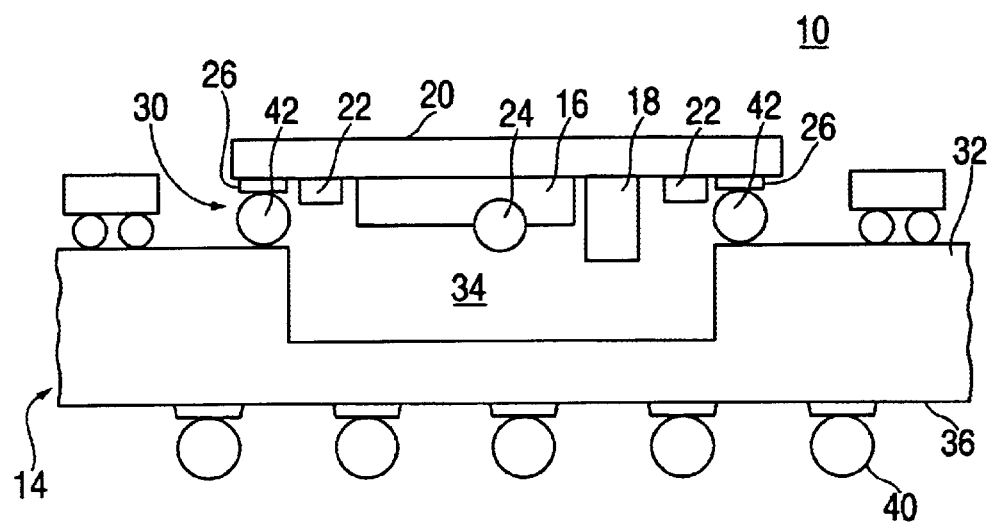
FIG. 1 is a cross sectional view of a SiOB module attached to a ceramic carrier.

Referring to FIG. 1, an exemplary embodiment illustrating the structure of a SiOB module 10 attached to a ceramic chip carrier 14 is shown. SiOB module 10 comprises a laser diode 16 and a photo monitor detector 18 wire bonded to a silicon optical bench (SiOB) 20. The SiOB 20 also has surface mounted technology (SMT) devices 22, such as a capacitor. The SiOB 20 is preferably a monocrystalline material such as a silicon. SiOB module 10 can be used for the transmission of light from an optoelectronic transmitter, (e.g., laser diode 16), as well as for the reception of light from an optical fiber 24 by way of a photo diode which will replace the laser diode in a optoelectronic receiver module, (e.g., photo detector 18). It will be clear to those skilled in the art that other elements such as ball lens, isolator etc. not shown in these drawings, are typically included for optimal performance of an optoelectronic transmitter and receiver modules. The optical fiber 24 is passively aligned to the SiOB 20 by techniques known in the art. The SiOB 20 structure provides a terminal metallurgy that allows for wire bonding laser diode 16 and photo detector 18, as well as solder joining for the SMT devices 22. In addition, SiOB terminal metallurgy provides solder bond pads 26 for joining a mini ball grid array (mini-BGA) 30 that further joins SiOB module 10 to top surface metallurgy (TSM) 32 of chip carrier 14. Chip carrier 14 includes a cavity 34 in which diodes 16, 18, fiber 24 and SMT devices 22 are disposed. On a bottom surface metallurgy (BSM) 36 of carrier 14 is a BGA 40 for attaching chip carrier 14 to a card (not shown). The mini-BGA 30 comprise balls 42 that are used to attach the singulated SiOB module 10 to chip carrier 14 after the diodes 16, 18 and SMT components or devices 22 are attached to SiOB 20 wafer.

Figure 2A:
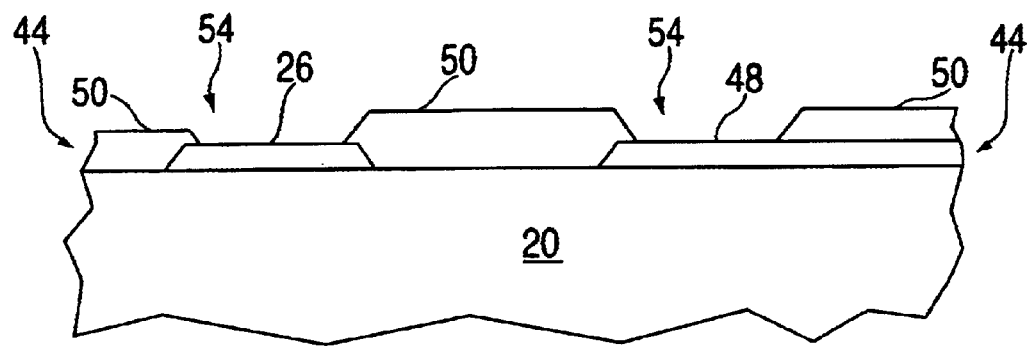
FIG. 2a is a cross sectional view of a metallization layer of a SiOB module for both wire bonding and solder bonding.
Figure 2B:
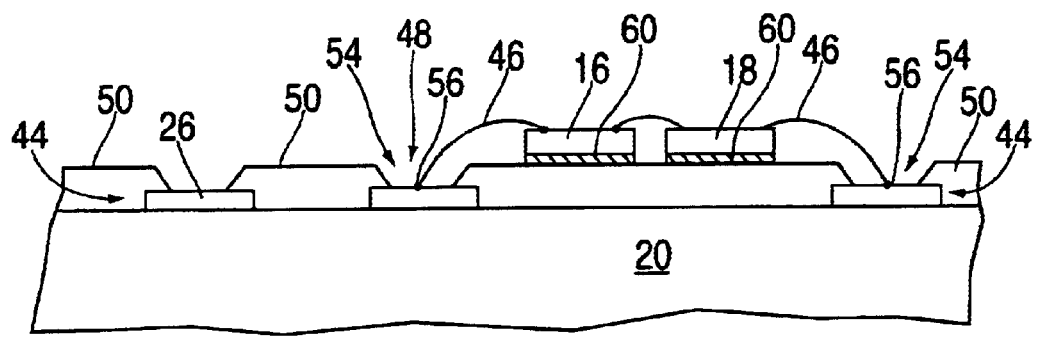
FIG. 2b is a cross sectional view of a SiOB module with optical components attached.
Figure 2C:
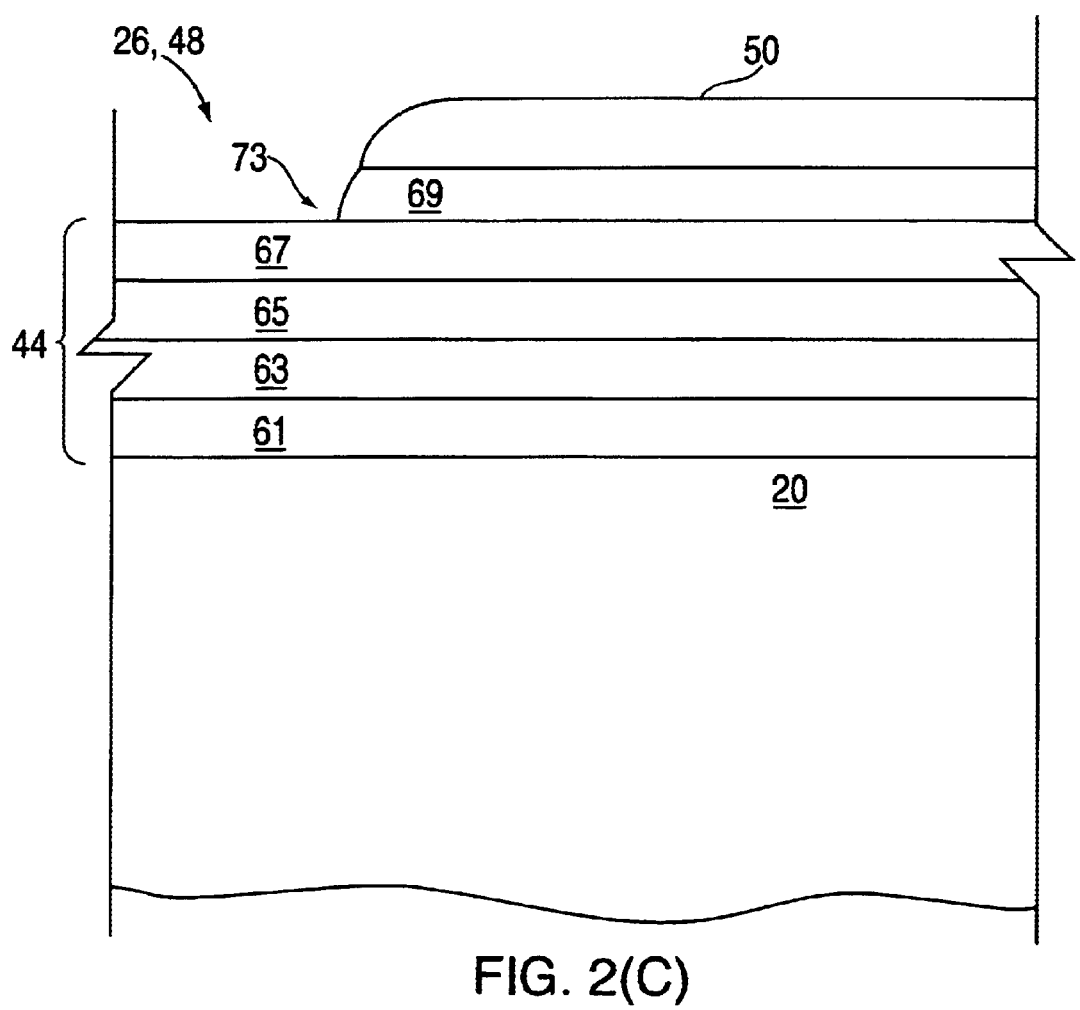
FIG. 2c is an enlarged portion of the cross sectional view of the SiOB module in FIG. 2a detailing a metallization layer.

A metallization layer or terminal metal structure 44 is commonly used on a SiOB 20 to facilitate either wire bonding 46 or solder bonding providing both electrical and mechanical connection for the optical devices connected thereon and solder bonding mini-BGA 30. FIGS. 2a, 2b and 2c show the terminal metal structure 44 that allows both wire bond pads 48 which are used to make electrical contacts to laser diode 16 and photo detector 18 that are mounted on the SiOB, as well as mini-BGA pads 26. In addition, solder bond pads (not shown) are provided for SMT devices 22. The wire bond pads 48 and mini-BGA pads 26 are connected by surface wiring lines allowing signal communication between other carriers and diodes 16, 18. A terminal metallurgy process is disclosed herein that allows wire bonding, solder bonding (to mini-BGA pads) and prevents solder wetting the lines beyond the mini-BGA solder bond pads 26. Such solder run down can cause reliability problems by depleting the amount of solder from the mini-BGA ball 42 and cause cracking of the thin film surface lines due to intermetallic formation with Cr/Cu/Au or Cr/Cu/Ni/Au pads which are used for wire bond pads 48 and solder bond pads 26 on devices. The metallurgical structure and process disclosed comprises a SiOB wafer 20 having a Cr/Cu/Ni/Au/Cr metallization layer 44 deposited by evaporation through a resist mask in a desired pad and surface wiring pattern. Metallization provides the layer of conductive metal which connects the semiconductor devices fabricated on the wafer 20. This conductive layer provides the required method for distributing electricity throughout the device. Once the heated material evaporates, it condenses on the cooler surface of the wafer. The Cr/Cu/Ni/Au/Cr metallization is deposited on the SiOB wafer 20 by evaporation through a resist mask in the desired pad and surface wiring patterns. In an exemplary embodiment, as best seen in FIG. 2c, a first Cr layer 61 is deposited followed by a Cu layer 63, then a Ni layer 65 is deposited, followed by a Au layer 67, and lastly a second Cr layer 69 is deposited. The thicknesses of each deposited layer are; first Cr layer 61: about 200–about 800 angstroms, Cu layer 63: about 3–about 5 microns, Ni layer 65: about 2–about 4 microns, Au layer 67: about 0.4–about 0.7 microns and second Cr layer 69: about 500–about 1000 angstroms. Next, a thin passivation layer 50 such as $SiO_2$, $Si_3N_4$ or polyimide dielectric is deposited over the surface of metallization 44 (FIGS. 2a, 2b and 2c). An inorganic dielectric (e.g., $SiO_2$, $Si_3N_4$) utilized as passivation layer 50 has a thickness of about 2000 to about 3000 angstroms. If a polyimide is utilized as passivation layer 50, it has a thickness of about 4–about 6 microns. Openings 54 are created in passivation layer 50 over wire bond pads 48 and mini-BGA pads 26 by standard wafer processes, such as, for inorganic dielectrics, using $CF_4$ or $CF_6$ Reactive Ion Etching (RIE) to etch both the dielectric and top Cr layer leaving the Au layer exposed. For a polyimide passivation layer 50, using $O_2$ RIE to etch polyimide followed by $CF_4$ to etch the top Cr layer. At this stage, the wire bond pad 48 and mini-BGA bond pad 26 have a Cr/Cu/Ni/Au metallurgy. This metallurgy provides a solder wettable surface for solder bonding and is wire bondable using Au wire to form Au ball bonds 56.

In order to prevent solder wetting down the conducting lines that connect the wire bond pads 48 and the mini-BGA pads 26 during the ball 42 attach to pads 26, a diffusion process is utilized that diffuses Cr from second Cr layer 69 into the lines proximate the exposed Au layer 67 that forms pads 48. A line being referred to is the electrical trace that connects a wire bond pad 48 to a mini-BGA pad 26. This line provides the electrical connection from the ceramic chip carrier 14 through mini-BGA ball 42 to the optical device such as a laser diode 16. Diffusion is a chemical process, wherein the wafer 20 is heated to a high temperature, facilitating the diffusion of dopant atoms into the wafer surface. Solid state diffusion occurs when the thermal driving force (heat) is applied to the wafer 20 in which a concentration gradient of the dopant material exists. This "diffusion" gradient drives the dopant atoms from regions of higher concentration to regions of lower concentration as shown by arrow 73 in FIG. 2c. In an exemplary embodiment, SiOB 20 is raised to a temperature of about 380° C. to about 420° C. for about one to about four hours. The diffusion should be done in forming gas or hydrogen ambient to prevent Ni out diffusion and oxidation. During this thermal excursion, Cr diffuses into the Au layer of the lines (about 1 to 2%). The Cr poisoning of the thin Au layer is sufficient to prevent solder wetting down the lines intermediate the pads during the mini-BGA 42 attach.

Turning to FIG. 2b, laser diode 16 and photo detector 18 are then attached to die bond pads 60 having an exposed Au layer for preferably attaching laser diode 16 and photo detector 18 with a thermal epoxy dispensed on the bond pads 60. Laser diode 16 and photo detector 18 are then bonded using applied pressure and allowing the epoxy to cure to set. The thermal epoxy utilized is stable after curing at peak temperatures of 150–260° C. for about 5–10 minutes during subsequent processing. An alternative method to bond laser diode 16 and photo detector 18 to die bond pads 60 utilizes a 80/20 Au/Sn preform on pads 60. A metallization of Cr/Ni/Au or similar wettable surface would be required on a complementary joining surface of laser diode 16 and photo detector 18. The 80/20 Au/Sn alloy is chosen for its preferred temperature hierarchy during subsequent assembly of the module 10 to carrier 14 and subsequent assembly of carrier 14 to the card (not shown). More specifically, in utilizing either of the two above methods for attaching laser diode 16 and photo detector 18, the interface between these optical devices 16, 18 and SiOB 20 does not melt and thus interfere with the alignment of these previously mounted optical devices 16, 18 during subsequent assembly. After the laser diode 16 and photo detector 18 are disposed to SiOB wafer 20, the SiOB wafer is singulated or diced into at least one SiOB chicklet. Input/Output (I/O) pads of laser diode 16 and photo detector 18 are then wire bonded to wire pads 48 (FIG. 2b).

Figure 3:
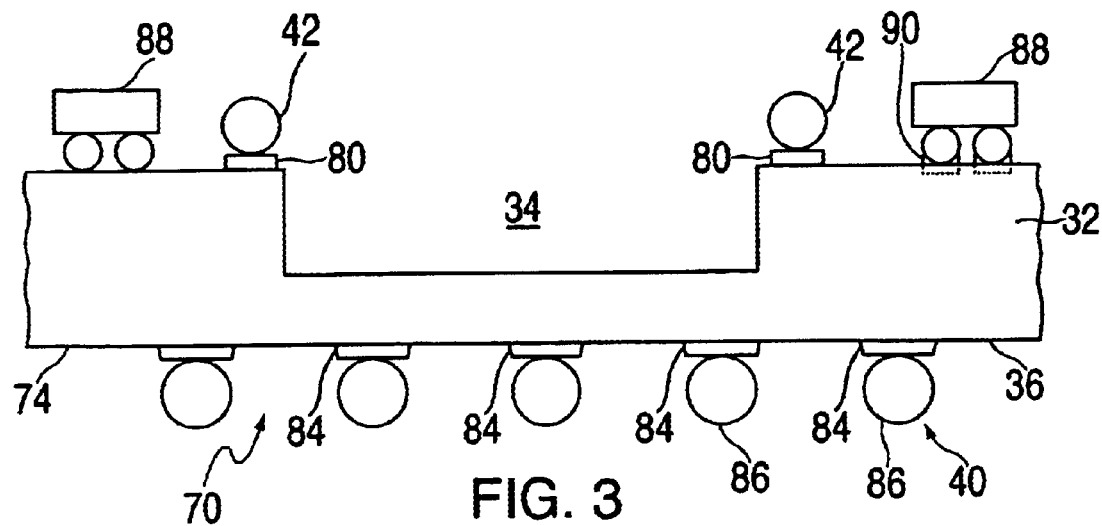
FIG. 3 is a cross sectional view of a ceramic carrier with an exemplary embodiment of a mini-BGA for attaching a SiOB module.

Turning to FIG. 3, an exemplary embodiment of a BGA carrier 70 is shown for subsequent assembly to SiOB module 10. BGA carrier 70 comprises a ceramic chip carrier having a top surface metallurgy (TSM) 72 defining a top surface and a bottom surface metallurgy (BSM) 74 defining a bottom surface of the multilevel chip (MLC) carrier 70. Proximate TSM 72 is a cavity 34 configured to provide clearance for optical devices 16,18 and 24 (FIG. 1) and any SMT devices 22 mounted to SiOB module 10 and optionally includes surface mount pads (not shown) for additional SMT devices 88 such as capacitors to be mounted on the ceramic carrier 14. TSM 72 also includes mini-BGA pads 80 disposed in one or two arrays on each side of cavity 34 for attaching mini-BGA balls 42 that electrically and mechanically connect SiOB module 10 to carrier 70. Pads 80 have a complementary size and pitch to the mini-BGA pads 26 on SiOB 20. Mini-BGA pads 80 have an approximate diameter of 0.25 to 0.50 mm and a pitch of about 0.5 to 1.0 mm. BSM 74 includes BGA pads 84 for attaching balls 86 that make up BGA 40 for connection to a card (not shown). Each BGA pad 84 on BSM 74 has an approximate diameter of 0.75 to 0.87 mm and a pitch of about 1.00 to 1.27 mm.

Referring to FIGS. 1–3, a description follows of the solder materials and process sequence that allows the assembly of SiOB module 10 to ceramic carrier 14 with the process flow and temperature hierarchy required. As will be appreciated in the art, the temperature hierarchy in subsequent processes of the process sequence allows subsequent processing at lower temperatures that limits any reflowing that may cause misalignment of a device mounted in a prior process. It will be appreciated that since flux can not be used when the SiOB module 10 is joined, the process flow is designed such that the mini-BGA balls 42, SMT devices 88 and BGA balls 86 are joined to the ceramic carrier 14 with a normal flux process, before the SiOB module 10 is attached to the carrier without flux.

First, mini-BGA balls 42 which are made out of a relatively high melt solder such a Sn/Sb that melts around 240° C. when Sn comprises approximately 5–10% of the solder alloy composition. Mini-BGA balls 42 are joined to carrier 14 using a preform process with either a water soluble or solvent clean flux. Next, a flux clean process is utilized to clean the flux from carrier 14.

SMT pads 90 are then coated with a eutectic Sn/Pb paste and SMT devices 88 disposed on TSM 72 of carrier 14. Ceramic carrier 14 is aligned and placed on a graphite fixture (not shown) having an array of eutectic BGA balls 86 that have been coated with a water soluble or solvent based flux. Both the SMT devices 88 and BGA balls 86 are joined to carrier 14 in one reflow at approximately 220° C. peak. During this reflow, the Sn/Sb mini-BGA balls 42 do not melt. Next, a flux clean process is again utilized to clean the flux from carrier 14.

In the alternative of using eutectic Sn/Pb paste for attaching SMT devices 88, a lead-free solder such as Sn/Ag/Cu (e.g., 3–4% Ag, 0.5–1.0% Cu) having a melting point of 218° C. or Sn/In/Ag/Cu (e.g., 10% In, 3% Ag, 1% Cu) having a melting point of about 200° C. is optionally utilized in light of the current thrust towards lead-free microelectronics assembly. In this way, lead-free interconnections are employed throughout the optical subassembly; from attaching laser diode 16 and photo detector 18 to SiOB 20 by using Au/Sn solder, wire bonding these devices 16, 18 to SiOB 20, and joining SiOB 20 to ceramic chip carrier 14 and thereafter joining chip carrier 14 to an organic card (not shown).

After the flux clean process, SiOB module 10 is joined to mini-BGA peripheral array 30 by one of two fluxless processes. One process comprises aligning and placing the SiOB 20 to mini-BGA balls 42 that depend from carrier 14 and reflowing in $H_2$ gas without using flux. A second process involves a plasma assisted process. In this process, SiOB module 10 is placed in a plasma chamber with florinated gases such as $CF_4$ or $CF_6$ being ionized in the plasma chamber and reacting with Sn-rich surfaces to enhance wetting of molten Sn-rich solder to Ni/Au mini-BGA pads 26 on SiOB 20. Before either assembly process is utilized, optic fiber 24 is precisely aligned and bonded to the singulated SiOB module 10 to assure proper optical beam coupling between the laser diode and the fiber core.

After SiOB module 10 is joined to chip carrier 14, the optical subassembly 10, 14 is joined to an organic card (not shown). Joining the optical subassembly is preferably done with a no-clean solder paste on I/O pads or lands on the card. Alternatively, the subassembly 10, 14 is joined to the card using plasma assisted fluxless joining described above. The above described structure and method ensure alignment of optical devices joined to a SiOB when the SiOB is joined to a chip carrier with a mini-BGA 30. More specifically, the Au/Sn solder joint between the optical devices 16, 18 do not melt during subsequent joining of SiOB 20 to a chip carrier 14. Similarly, the SiOB joints (i.e., mini-BGA) to the ceramic carrier 14 does not melt when joining the optical subassembly 10, 14 to a card, and thus retains the alignment of the SiOB 20 to the ceramic carrier 14.

Figure 4:
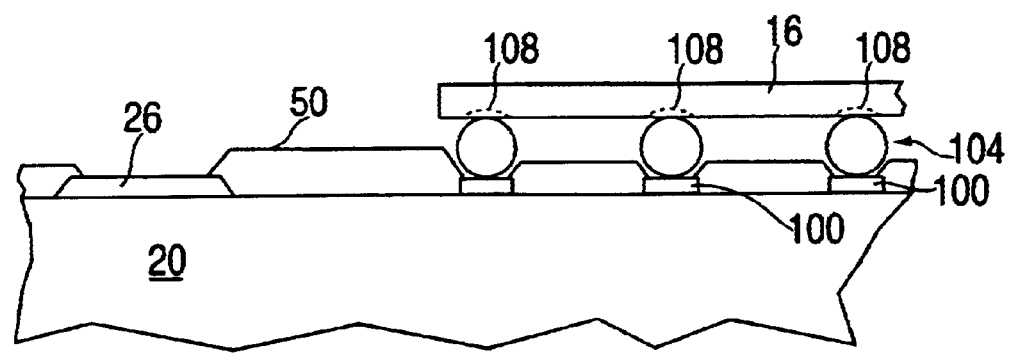
FIG. 4 is a cross sectional view of a SiOB module having a flip-chip boded laser diode in accordance with one embodiment of the present disclosure.

Referring to FIG. 4, an alternative embodiment illustrates laser diode 16 flip-chip bonded to SiOB 20, rather than having a wire bonded termination to SiOB 20. The wire bond pads 48 shown in FIG. 2b are replaced by an area array of flip-chip pads 100. Optical devices 16, 18 are then joined with a high melt solder bump 104 such as, for example using a Pb/Sn solder bump having a Sn composition in the range of about 3% to about 10%. During subsequent assembly processes described above, the joints between SiOB 20 and optical devices 16, 18 would not melt based on this temperature hierarchy. An alternative lead-free option for this flip-chip bonded structure includes forming Au studs on bond pads 100 and then joining the optical devices 16, 18 by pressing down on devices 16, 18 when Au bumps are formed at elevated temperatures of about 250° C. to about 300° C. Bond pads 108 for electrically and mechanically connecting to Au bumps require a metallurgy such as Cr/Au or Cr/Cu/Au having Au thickness in the range of about 0.5 microns to about 1 micron. Utilization of flip-chip assembly for optical devices 16, 18 results in more efficient packaging of optical devices that reduce the area needed for packaging these devices on a SiOB. Furthermore, reducing optical device connection length reduces signal propagation time. In addition, for gigabit data rates that these devices are designed to operate at, flip-chip connections will reduce inductance compared to the 2 to 4 mm connection lengths typical for wire bond termination of these same devices.

Although the drawings depict optical devices mounted on the SiOB as a laser diode and photo detector, this disclosure is not to be construed as being limited to just laser diodes and photo detectors. Other optical devices suitable for use in the present disclosure will be apparent to those skilled in the art in view of this disclosure. For example, light emitting diodes (LED's) may be used to transmit a light signal instead of a laser diode.

Many modifications and variations of the invention will be apparent to those skilled in the art in light of the foregoing disclosure. Therefore, it is to be understood that, within the scope of the appended claims, the invention can be practiced otherwise than has been specifically shown and described.

What is claimed is:

1. A process of forming an optical subassembly in an integrated circuit, the process comprising:
   defining electrically conducting lines and bonding pads in a metallization layer on a substrate;
   depositing a passivation layer over said metallization layer;
   etching said passivation layer to remove said passivation layer from each of said bonding pads and a portion of said metallization layer corresponding with each of said bonding pads;
   diffusing Cr from said lines proximate said bonding pads to prevent solder wetting down lines;
   bonding an optical device to one of said bonding pads; and
   attaching said substrate to a carrier utilizing solder bond attachment.

2. The process according to claim 1 further comprising:
   obtaining a carrier having a cavity on a first side of said carrier, said cavity configured to provide clearance for said optical device bonded to said substrate; and
   attaching a mini ball grid array (mini-BGA) on said first side.

3. The process according to claim 2 further comprising attaching a ball grid array (BGA) on a second side of said carrier for subsequent mounting of said optical subassembly.

4. The process according to claim 3 further comprising:
   aligning said mini-BGA of said carrier with a portion of said bonding pads designated to receive said mini-BGA on said substrate; and
   joining said carrier to said substrate utilizing a fluxless process to keep said optical device clean.

5. The process according to claim 3, wherein said BGA include solder balls having a melting point of about 183° C.

6. The process according to claim 2, wherein said mini ball grid array (mini-BGA) on either side of said cavity includes solder balls having a melting point of about 240° C.

7. The process according to claim 6, wherein said joining said carrier to said substrate includes reflowing of said solder balls by a fluxless process.

8. The process according to claim 7, wherein said fluxless process includes one of:
   reflowing in $H_2$ gas, and
   ionizing fluorinated gases in a plasma chamber and reacting with Sn-rich surfaces to enhance wetting of molten Sn-rich solder to said bonding pads on said SiOB.

9. The process according to claim 2, wherein surface mount technology (SMT) devices are mounted on said first side of said carrier.

10. The process according to claim 1, wherein subsequent attaching components to the subassembly utilizes a temperature hierarchy to prevent movement of said optical device relative to said substrate, and said substrate relative to said carrier when said subassembly is heated for said subsequent attaching.

11. The process according to claim 1, wherein said bonding pads allow for wire bond attachment and solder bond attachment.

12. The process according to claim 1, wherein said forming of said metallization layer comprises:
   depositing a first Cr layer on said substrate;
   depositing a Cu layer on said first Cr layer;
   depositing a Ni layer on said first Cu layer;
   depositing a Au layer on said Ni layer; and
   depositing a second Cr layer on said Au layer.

13. The process according to claim 12, wherein the first Cr layer thickness is about 200 to about 800 Å (angstroms), the Cu layer thickness is about 3 to about 5 $\mu$M (microns), the Ni layer thickness is about 2 to about 4 $\mu$M (microns), the Au layer thickness is about 0.4 to about 0.7 $\mu$M (microns), and the second Cr layer thickness is about 500 to about 1000 Å (angstroms).

14. The process according to claim 12, wherein said portion of metallization layer removed is said second Cr layer.

15. The process according to claim 1, wherein said passivation layer comprises a material selected from the group consisting of a $SiO_2$, $Si_3Ni_4$, polyimide dielectrics and mixtures thereof.

16. The process according to claim 1, wherein said passivation layer has a thickness of about 2000 to about 3000 Å (angstroms) when $SiO_2$ or $Si_3Ni_4$ is utilized.

17. The process according to claim 1, wherein said passivation layer has a thickness of about 2 to about 4 $\mu$M (microns) when polymide is utilized.

18. The process according to claim 1, wherein said one of said bonding pads for said optical device comprises an area array of flip-chip bond pads.

* * * * *